United States Patent
Suzuki

(10) Patent No.: US 6,274,487 B1
(45) Date of Patent: Aug. 14, 2001

(54) METHOD FOR MANUFACTURING SEMICONDUCTOR DEVICE

(75) Inventor: Yoshihide Suzuki, Kasaoka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/327,171

(22) Filed: Jun. 7, 1999

(30) Foreign Application Priority Data

Jun. 30, 1998 (JP) .................................................. 10-183465

(51) Int. Cl.[7] .................................................. H01L 21/44
(52) U.S. Cl. ........................ 438/653; 438/660; 438/685
(58) Field of Search .................................. 438/688, 683, 438/648, 656, 660, 653, 654, 909, 685, 643, 644

(56) References Cited

U.S. PATENT DOCUMENTS

| | | | | |
|---|---|---|---|---|
| 5,449,954 | * | 9/1995 | Ito | 257/751 |
| 5,514,908 | * | 5/1996 | Liao et al. | 257/751 |
| 5,573,978 | * | 11/1996 | Cho | 438/688 |
| 5,976,969 | * | 11/1999 | Lin et al. | 438/629 |
| 5,985,759 | | 11/1999 | Kim et al. | |

FOREIGN PATENT DOCUMENTS

| | | |
|---|---|---|
| 5(1993)-259116 | 10/1993 | (JP) . |
| 6(1994)-85084 | 3/1994 | (JP) . |
| 7(1995)-29853 | 1/1995 | (JP) . |

* cited by examiner

*Primary Examiner*—Caridad Everhart
(74) *Attorney, Agent, or Firm*—Nixon & Vanderhye P.C.

(57) ABSTRACT

A method for manufacturing a semiconductor device includes the steps of: forming an interlayer dielectric film on a silicon substrate having a diffusion layer formed in one-side surface thereof; forming at least one contact hole in the interlayer dielectric film; forming a first high melting-point metal film and a first high melting-point metal nitride film on the surface of the contact hole in this order as a barrier metal; thermal treatment for improvement of a barrier property of the first high-melting point metal nitride film; and forming a second high melting-point metal nitride film, a second high melting-point metal film, and an aluminum-containing wiring film to fill the contact hole in this order in the same atmosphere.

12 Claims, 4 Drawing Sheets

METHOD FOR MANUFACTURING SEMICONDUCTOR DEVICE

CROSS-REFERENCES TO RELATED APPLICATIONS

This application is related to Japanese patent application No. HEI 10-183465 filed on Jun. 30, 1998 whose priority is claimed under 35 USC §119, the disclosure of which is incorporated herein by reference in its entirety.

BACKGROUND OF THE INVENTION

1. Field of the Invention

The present invention relates to a method for manufacturing a semiconductor device, and more particularly to a technique for filling a contact hole formed in an interlayer dielectric film with a wiring (plug) made of aluminum (Al) or an aluminum alloy.

2. Description of the Related Art

In accordance with the development of high integration and size reduction in semiconductor devices, a contact hole formed in an interlayer dielectric film is also becoming smaller in size and coming to have a higher aspect ratio. As a method for forming a plug by filling the contact hole of a small size with a metal in order to establish a good electric connection in the wiring via the plug in the contact hole, there are known several methods such as the high temperature Al sputtering method, the high temperature Al reflowing method, the tungsten CVD method or the like. Among these, the high temperature Al sputtering method and the high temperature Al reflowing method are attracting people's attention because the contact hole can be filled with a low resistance material and, in addition, the wiring film and the plug can be formed at the same time, thereby leading to reduced costs, as compared with the tungsten CVD method.

The high temperature Al sputtering method is a technique of sputtering an Al-based material such as Al or an Al alloy with the substrate heated at 400 to 500° C. to reflow the Al-based material so as to fill the contact hole formed in the interlayer dielectric film with the Al-based material for forming the plug.

If the contact hole is filled with an Al-based material for forming a plug to electrically connect a wiring film disposed on an interlayer dielectric film with a diffusion layer in a Si substrate, a junction leakage is generated due to a phenomenon called "spike" in which Al diffuses abnormally into the diffusion layer of the Si substrate. A barrier metal is required in order to prevent this leakage. Generally, a TiN film or a TiW film is used as the barrier metal. If the TiN film is to be used, a laminated structure of TiN/Ti is adopted so as to reduce the contact resistance of the plug.

Also, if an Al-based material film 17 is directly formed on a TiN film 16 in order to fill the contact hole with the Al-based material by the high temperature sputtering method, the reflowing of the Al-based material film is not sufficient. Therefore, voids 18 tend to be generated as shown in FIG. 2. Therefore, in order to improve the wettability of the barrier film, a Ti/TiN/Ti structure is adopted in which a Ti film is formed on the TiN film which is the barrier film.

However, as the size reduction develops to reduce the diameter of the contact hole to less than a half micron, the conventional TiN film does not provide a sufficient barrier property when the barrier film is formed by the sputtering method, because the thickness of the barrier film at the bottom of the contact hole is small.

Therefore, in order to increase the barrier property, Japanese Unexamined Patent Publication No. HEI 07(1995)- 29853, for example, discloses a method of increasing the barrier property by treating the TiN film of the barrier film with nitrogen.

Namely, as shown in FIG. 3(a), an interlayer dielectric film 13 is formed on a Si substrate 11 having a diffusion layer 12 formed therein. A contact hole 14 is then formed in the inter layer dielectric film 13. Further, a Ti film 15 is formed thereon, followed by forming a TiN film 16, as shown in FIG. 3(b). Then, an annealing treatment is carried out in a nitrogen atmosphere to form a TiN reformed film 16a to increase the barrier property, as shown in FIG. 3(c).

Also, Japanese Unexamined Patent Publication No. HEI 05(1993)-259116 discloses a technique of adopting a Ti 20/TiON 19/Ti 15 structure including a TION film 19 having a high barrier property as a barrier film, as shown in FIG. 4.

The above-mentioned Japanese Unexamined Patent Publication No. HEI 07(1995)-29853 makes use of TiN as a wetting layer. However, if the contact hole is to be filled with an Al-based material, Ti is greatly excellent as a wetting layer.

However, if a Ti film is directly formed on the TiN film which serves as the barrier film, voids tend to be generated. This is due to the fact that the barrier film is oxidized to some extent during the barrier property improving process (an annealing treatment under an atmosphere containing nitrogen or under an atmosphere containing nitrogen and oxygen), so that the interface between the Al-based material formed on the barrier film and the Ti film is also oxidized, thereby degrading the wettability of the Ti film.

In Japanese Unexamined Patent Publication No. HEI 5(1993)-259116, Ti is formed as a wetting layer on the TiON film, so that Ti is oxidized to degrade the wettability, in the same manner as above.

Japanese Unexamined Patent Publication No. HEI 06(1994)-85084, for example, proposes a method for preventing the oxidation of Ti in the wetting layer. According to this method, a non-doped polysilicon film or an impurity-introduced polysilicon film is formed as an antioxidation film on the inner wall of the contact hole before the contact hole opened in the interlayer dielectric film is filled with an Al-based material.

However, these films have a high resistance, so that it is necessary to remove a portion of the film at the bottom of the contact hole in order to reduce the resistance of the plug in the contact hole. This involves complicated manufacturing steps.

SUMMARY OF THE INVENTION

The present invention provides a method for manufacturing semiconductor device comprising the steps of: forming an interlayer dielectric film on a silicon substrate having a diffusion layer formed in a one-side surface thereof; forming at least one contact hole in the interlayer dielectric film; forming a first high melting-point metal film and a first high melting-point metal nitride film on the surface of the contact hole in this order as a barrier metal; thermal treatment for improvement of a barrier property of the first high-melting point metal nitride film; and forming a second high melting-point metal nitride film, a second high melting-point metal film, and an aluminum-containing wiring film to fill the contact hole in this order in the same atmosphere.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Hereafter, the present invention will be explained with reference to an embodiment of the present invention.

Figure 1A:
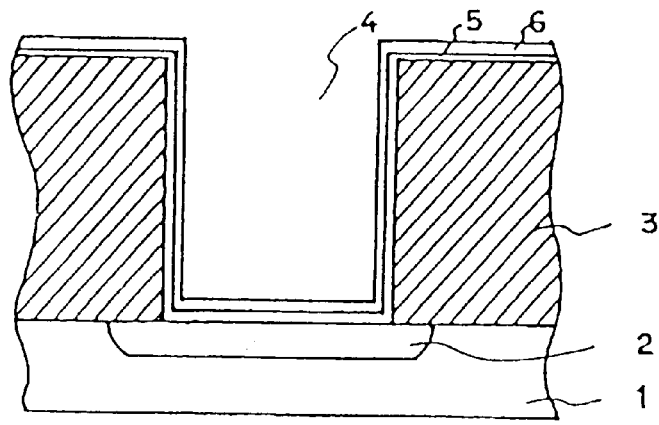
FIGS. 1(a), 1(b) and 1(c) are views showing steps for manufacturing a semiconductor device according to the present invention.
Figure 1B:
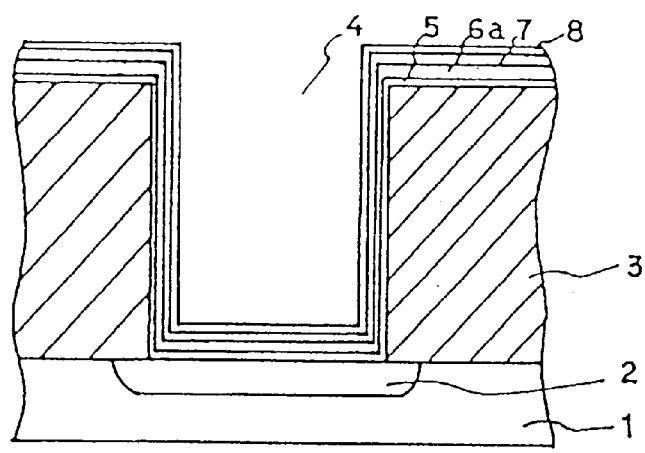
Figure 1C:
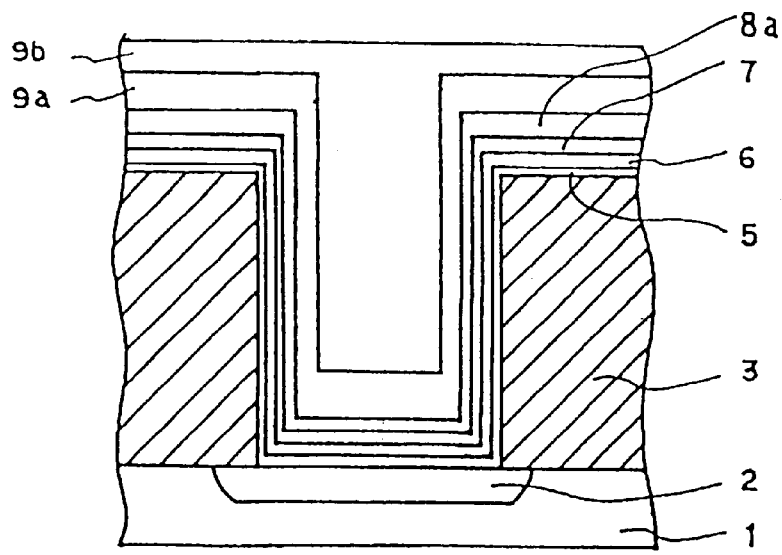
Figure 2:
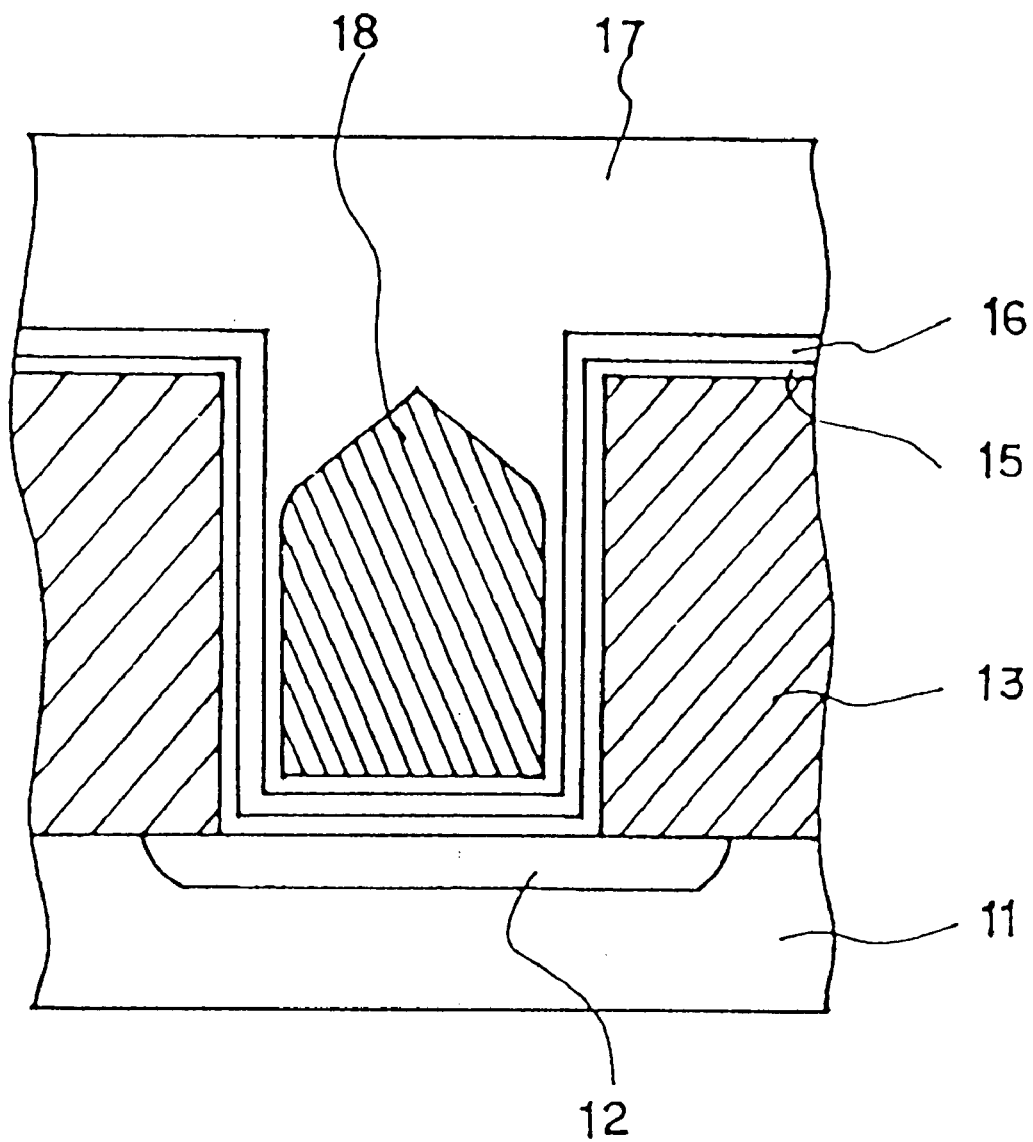
FIG. 2 is a view showing a step for manufacturing a semiconductor device according to a first prior art.
Figure 3A:
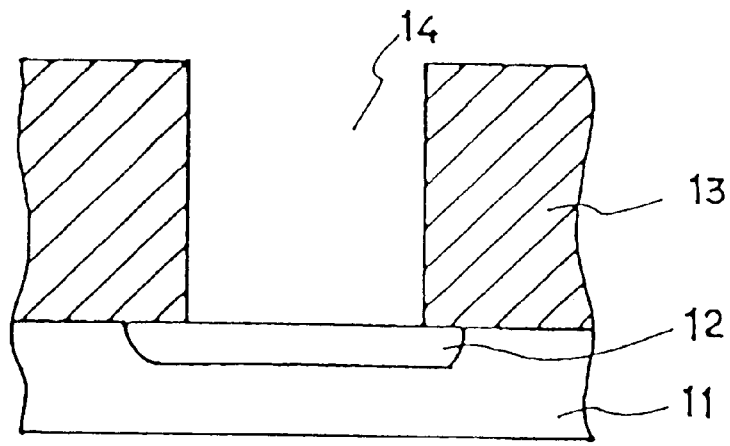
FIGS. 3(a), 3(b) and 3(c) are partial cross-sectional views showing steps for manufacturing a semiconductor device according to a second prior art.
Figure 3B:
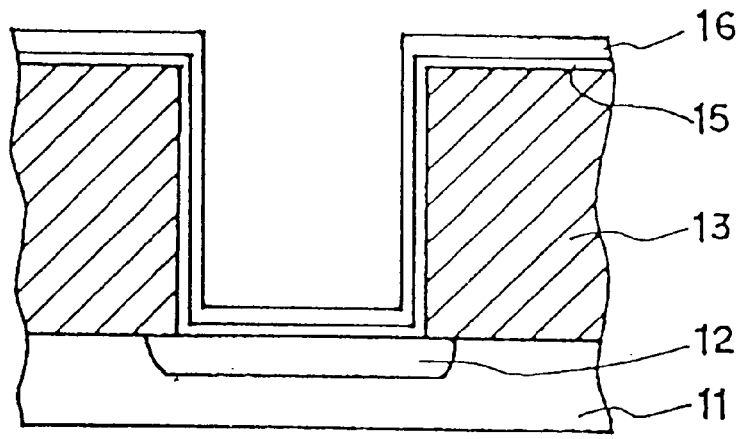
Figure 3C:
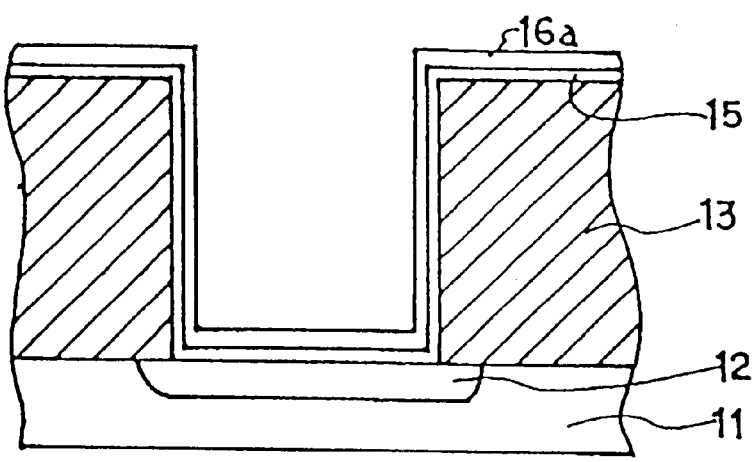
Figure 4:
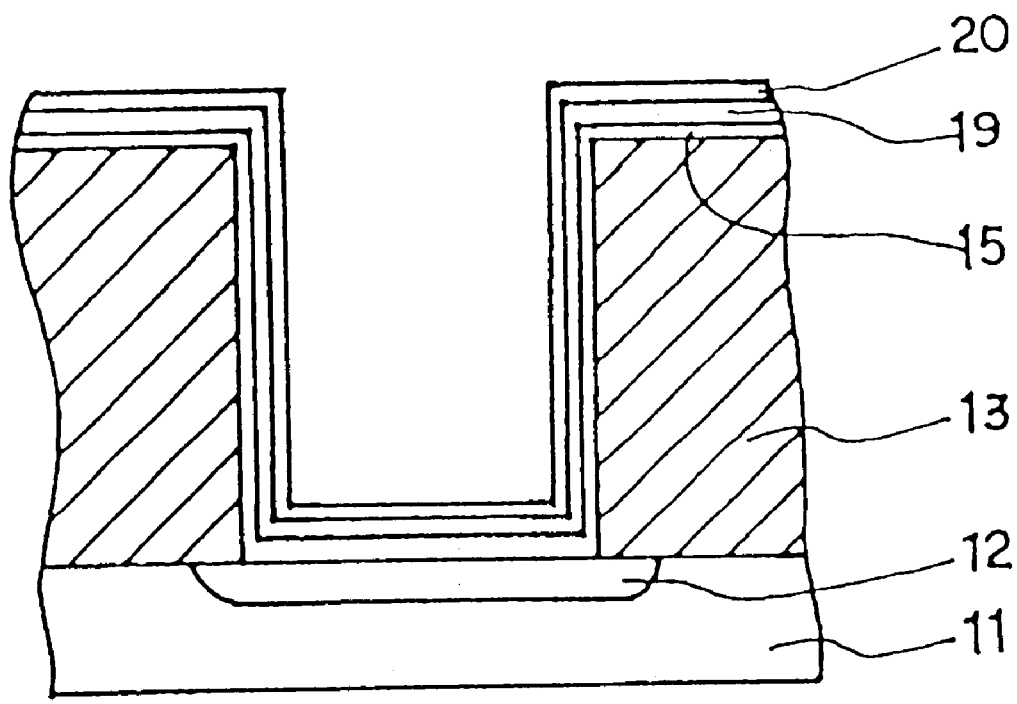
FIG. 4 is a view for explaining a problem of the prior arts.

FIGS. 1(a) to 1(c) are views showing steps for manufacturing a semiconductor device according to an embodiment of the present invention. Referring to FIGS. 1(a) to 1(c), the semiconductor device includes a silicon substrate 1, a diffusion layer 2, an interlayer dielectric film 3, a contact hole 4, a first Ti film (first high melting-point metal film), a first TiN film 6 (first high melting-point metal nitride film), a reformed TiN film 6a, a second TiN film 7 (second high melting-point metal nitride film), a second Ti film 8 (second high melting-point metal film), a first Al-based metal film 9a, and a second Al-based metal film 9b. The first and second Al-based metal films 9a and 9b correspond to an aluminum-containing wiring layer. Besides Ti, the high melting-point metal may be, for example, Mo or W.

First, the interlayer dielectric film 3 is formed to a thickness of about 1.0 $\mu$m on the silicon substrate 1 having the diffusion layer 2 formed in a surface thereof. By a known lithography technique and a dry etching technique, the contact hole 4 that reaches the diffusion layer 2 is formed in the interlayer dielectric film 3. The contact hole 4 has a diameter of about 0.5 $\mu$m. Here, the present invention is especially useful if the contact hole has an aspect ratio (height/diameter) of 2 or more.

Subsequently, the first Ti film 5 having a thickness of 0.02 to 0.06 $\mu$m, for example about 0.03 $\mu$m, and the first TiN film 6 having a thickness of 0.15 to 0.22 $\mu$m, for example about 0.18 $\mu$m, are formed in this order in the contact hole by the sputtering method or the like.

Subsequently, an annealing treatment is carried out at 500 to 600° C. for 40 minutes in a furnace under an atmosphere containing nitrogen or under an atmosphere containing nitrogen and oxygen for improvement of a barrier property of the first TiN film 6. By this treatment, the first TiN film 6 changes its film quality, whereby the crystallinity of the TiN is improved. Further, TiO$_x$ or Ti (ON)$_x$ is taken into a site between the TiN crystals (TiN grain boundary) that form the TiN film, thereby forming a reformed TiN film 6a which is thermally and chemically stable. This reformed TiN film 6a contains oxygen in the film or at least on the surface of the film.

Then, the second TiN film 7 preferably having a thickness of 0.06 to 0.08 $\mu$m, for example about 0.07 $\mu$m, a second Ti film 8 preferably having a thickness of 0.05 to 0.07 $\mu$m, for example about 0.06 $\mu$m, and the Al-based wiring films 9a and 9b made of Al or an Al alloy (for example, Al—Cu 0.5%, Al—Si 0.5% or the like) are formed in this order under the same atmosphere and without exposure to ambient air. The atmosphere for laminating these films may be, for example, a vacuum, a nitrogen atmosphere or a argon atmosphere.

However, if the second TiN film 7 has a thickness less than 0.05 $\mu$m, the second TiN film 7 does not adhere with a sufficient thickness to the sidewall of the contact hole near the bottom of the contact hole, thereby raising a problem that the reflowing of Al is not sufficient and voids are generated. On the other hand, if the second TiN film 7 has a thickness larger than 0.1 $\mu$m, the contact hole will be narrow at its upper portion due to the second TiN film 7, raising a problem that the Al-based wiring films 9a and 9b cannot enter the contact hole easily and voids are generated.

Further, if the second Ti film 8 has a thickness less than 0.04 $\mu$m, the second Ti film 8 does not adhere with a sufficient thickness to the sidewall of the contact hole near the bottom of the contact hole, thereby raising a problem that the reflowing of Al is not sufficient and voids are generated. On the other hand, if the second Ti film 8 has a thickness larger than 0.12 $\mu$m, the contact hole will be narrow at its upper portion due to the second Ti film 8, thereby raising a problem that the Al-based wiring films 9a and 9b cannot enter the contact hole easily and voids are generated.

Alternatively, the Al-based wiring films 9a and 9b may be formed by the following method. Namely, the first Al-based metal film 9a is formed preferably to a thickness of 0.27 to 0.33 $\mu$m, for example about 0.3 $\mu$m, on the inner wall of the contact hole at a substrate temperature of 50 to 150° C., for example about 100° C., by the high temperature sputtering method. Subsequently, the second Al-based metal film 9b is formed to a thickness that fills the contact hole, preferably to a thickness of 0.25 to 0.6 $\mu$m, for example about 0.3 $\mu$m, at a substrate temperature of 470° C.

Here, if the substrate temperature for forming the second Al-based metal film 9b is lower than 450° C, the reflowing of the Al-based metal is not sufficient, thereby raising a problem that voids are generated. Also, if the first Al-based metal film 9a has a thickness smaller than 0.25 $\mu$m, the surface of the second Al-based metal film 9b will be rough, thereby locally generating an area of the contact hole where the Al-based metal is not reflowed. Moreover, the first Al-based metal film 9a will not adhere to a sufficient thickness on the sidewall of the contact hole near the bottom of the contact hole, thereby raising a problem that the reflowing of the Al-based metal is not sufficient and voids are generated. On the other hand, if the first Al-based metal film 9a has a thickness larger than 0.5 $\mu$m, the contact hole will be narrow at its upper portion due to the first Al-based metal film, thereby raising a problem that the second Al-based metal film 9b cannot enter the contact hole easily. Further, if the second Al-based metal film 9b has a thickness smaller than 0.17 $\mu$m, the thickness of the second Al-based metal film will be insufficient, and sufficient time is not given for the reflowing of the Al-based metal, thereby raising a problem that voids are generated.

By the thermal treatment, the second Ti film 8 and the first Al-based metal film 9a react to form the Ti—Al alloy film 8a. As a result of this, a wiring film may be formed in which the contact hole 4 is filled with the Al-based metal film 9b without generating voids in the contact hole 4 and without generating spikes in the diffusion layer 2.

The reason why another TiN film 7 is formed between the reformed TiN film 6a and the Ti film 8 is to prevent oxidation of the Ti film 8 by oxygen contained in the TiN film 6a or on the surface of the TiN film 6a, which leads to generation of voids due to degradation of the wettability with the Al-based wiring films 9a and 9b. Also, the reason why the Ti film 8 is further formed on the TiN film 7 is due to the fact that the TiN film 7, when used alone, has a poor wettability as compared with a Ti film, whereby voids are generated to some extent if the contact hole has a diameter of about 0.5 μm.

FIGS. 1(a) to 1(c) show an example in which the method of the present invention is used for a single contact hole. However, the method of the present invention may also be applied for cases where a plurality of contact holes exist, as seen in FIGS. 1(a) to 1(c).

As described and shown in detail above, according to the present invention, a contact hole having a diameter of about 0.5 μm can be filled with an Al-based alloy material without generating voids in the contact hole and without generating spikes in a diffusion layer.

Further, by using Ti as the first and second high melting point metals, it is possible to prevent oxidation of the Ti film which is a layer having a better wettability.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What we claim is:

1. A method for manufacturing a semiconductor device comprising the steps of:

forming an interlayer dielectric film on a silicon substrate having a diffusion layer formed in a surface thereof;

forming at least one contact hole in the interlayer dielectric film;

forming a first high melting-point metal film and a first high melting-point metal nitride film on the surface of the contact hole in this order as a barrier metal;

thermally treating the first metal nitride film in an atmosphere including oxygen for improvement of a barrier property of the first high-melting point metal nitride film; and forming a second high melting-point metal nitride film, a second high melting-point metal film, and an aluminum-containing wiring film to fill the contact hole in this order in the same atmosphere without exposure to ambient air.

2. A method for manufacturing a semiconductor device according to claim 1, wherein the thermal treatment is carried out at 500 to 600° C.

3. A method for manufacturing a semiconductor device according to claim 1, wherein the aluminum-containing wiring film is formed by forming a first aluminum-containing metal film on an inner wall of the contact hole and then filling the contact hole with a second aluminum-containing metal film.

4. A method for manufacturing a semiconductor device according to claim 1, wherein the first high melting-point metal film and the second high melting-point metal film are titanium films, and the first high melting-point metal nitride film and the second high melting-point metal nitride film are titanium nitride films.

5. A method for manufacturing a semiconductor device according to claim 1, wherein the first high melting-point metal film has a thickness of 0.02 to 0.06 μm.

6. A method for manufacturing a semiconductor device according to claim 1, wherein the first high melting-point metal nitride film has a thickness of 0.15 to 0.22 μm.

7. A method for manufacturing a semiconductor device according to claim 1, wherein the second high melting-point metal nitride film has a thickness of 0.06 to 0.08 μm.

8. A method for manufacturing a semiconductor device according to claim 1, wherein the second high melting-point metal film has a thickness of 0.05 to 0.07 μm.

9. A method for manufacturing a semiconductor device according to claim 3, wherein the first aluminum-containing metal film has a thickness of 0.27 to 0.33 μm.

10. A method for manufacturing a semiconductor device according to claim 1, wherein the aluminum-containing wiring film comprises a single aluminum metal, an aluminum-copper alloy or an aluminum-silicon alloy.

11. A method for manufacturing a semiconductor device according to claim 1, wherein the contact hole has an aspect ratio (height/diameter) of 2 or more.

12. The method of claim 1, wherein the second high melting-point metal nitride film is not thermally treated before the second high melting-point metal film is formed thereon.

* * * * *